United States Patent
Hou et al.

(10) Patent No.: US 8,434,030 B1
(45) Date of Patent: Apr. 30, 2013

(54) INTEGRATED CIRCUIT DESIGN AND FABRICATION METHOD BY WAY OF DETECTING AND SCORING HOTSPOTS

(75) Inventors: Hsin-Ming Hou, Tainan (TW); Ji-Fu Kung, Taichung (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 13/343,774

(22) Filed: Jan. 5, 2012

(51) Int. Cl.
G06F 17/50 (2006.01)

(52) U.S. Cl.
USPC ............... 716/52; 716/54; 716/56; 716/112

(58) Field of Classification Search .......... 716/52, 716/54, 56, 112
See application file for complete search history.

(56) References Cited

U.S. PATENT DOCUMENTS

| | | | |
|---|---|---|---|
| 5,900,735 A | 5/1999 | Yamamoto | |
| 7,570,796 B2 * | 8/2009 | Zafar et al. | 382/144 |
| 7,617,475 B2 | 11/2009 | Lin et al. | |
| 7,707,526 B2 * | 4/2010 | Su et al. | 716/136 |
| 7,707,528 B1 | 4/2010 | White et al. | |
| 7,735,029 B2 | 6/2010 | Riviere-Cazaux | |
| 7,796,801 B2 * | 9/2010 | Kitamura et al. | 382/141 |
| 8,024,675 B1 * | 9/2011 | Gupta et al. | 716/54 |
| 2002/0079584 A1 | 6/2002 | Matsunaga | |
| 2007/0266248 A1 | 11/2007 | Cheng et al. | |
| 2007/0266346 A1 | 11/2007 | Wu | |
| 2007/0266356 A1 | 11/2007 | Chang et al. | |
| 2007/0266360 A1 | 11/2007 | Cheng et al. | |
| 2007/0266362 A1 | 11/2007 | Lai et al. | |
| 2008/0042271 A1 | 2/2008 | Dauksher et al. | |
| 2008/0134106 A1 | 6/2008 | Riviere-Cazaux | |
| 2009/0055011 A1 | 2/2009 | Leu et al. | |
| 2009/0222785 A1 | 9/2009 | Cheng et al. | |
| 2009/0297019 A1 * | 12/2009 | Zafar et al. | 382/145 |
| 2010/0077372 A1 * | 3/2010 | Xiang et al. | 716/12 |
| 2010/0095253 A1 | 4/2010 | Hou et al. | |
| 2010/0281446 A1 | 11/2010 | Hou et al. | |
| 2011/0047523 A1 * | 2/2011 | Garcia et al. | 716/122 |
| 2011/0286656 A1 * | 11/2011 | Kulkarni et al. | 382/144 |
| 2012/0151430 A1 * | 6/2012 | Emmanuel et al. | 716/126 |

OTHER PUBLICATIONS

Hou et al, "A Novel Transient Simulation for 3-D Multilevel Interconnections on Complex Topography", Apr. 1999, vol. 46, pp. 690-695, IEEE Transactions on Electron Devices.

* cited by examiner

*Primary Examiner* — Naum Levin
(74) *Attorney, Agent, or Firm* — WPAT PC; Justin King

(57) ABSTRACT

An integrated circuit design and fabrication method includes the following steps. Firstly, an integrated circuit design layout is provided. Then, a first hotspot group and a second hotpot group are searched from the integrated circuit design layout. Then, a hotspot score is acquired according to the first hotspot group, the second hotpot group and a product functionality. If the hotspot score is higher than a criterion, the integrated circuit design layout is corrected according to the first hotspot group and the second hotpot group.

13 Claims, 6 Drawing Sheets

1

INTEGRATED CIRCUIT DESIGN AND FABRICATION METHOD BY WAY OF DETECTING AND SCORING HOTSPOTS

FIELD OF THE INVENTION

The present invention relates to an integrated circuit design and fabrication method, and more particularly to an integrated circuit design and fabrication method by detecting and scoring hotspots in an integrated circuit design layout in a systematical and hierarchical architecture.

BACKGROUND OF THE INVENTION

As known, it takes multiple stages to fabricate an integrated circuit product from the beginning of designing the integrated circuit. Generally, some defects are possibly generated in any of the multiple stages. If the defect is found after the integrated circuit product is fabricated, it is necessary to identify the source of problems from the beginning. Under this circumstance, the speed of launching the product will be slowed down.

For solving these drawbacks, a simple rule (e.g. a minimum critical dimension) or a physical model is conventionally used in the circuit design layout in order to sieve out the area that is unable to tolerate the process variation. In such way, the hotspots prone to error in mass production can be identified in the earlier stages. After the hotspots are identified, the technician may try to improve the production process and eliminate the possible product weakness in the earlier stages. However, since the conventional method lacks systematical and hierarchical analyses, the estimated hotspots are far from the real electrical performance of the product. Under this circumstance, the product yield is usually unsatisfied. Therefore, there is a need of providing an integrated circuit design and fabrication method in order to obviate the drawbacks encountered from the prior art.

SUMMARY OF THE INVENTION

In accordance with an aspect, the present invention provides an integrated circuit design and fabrication method. The integrated circuit design and fabrication method includes the following steps. Firstly, an integrated circuit design layout is provided. Then, a first hotspot group and a second hotspot group are searched from the integrated circuit design layout. Then, a hotspot score is acquired according to the first hotspot group, the second hotspot group and a product functionality. If the hotspot score is higher than a criterion, the integrated circuit design layout is corrected according to the first hotspot group and the second hotspot group.

In an embodiment, the first hotspot group includes hotspots from systematic defects, and the second hotspot group includes hotspots from random defects.

In an embodiment, the integrated circuit design and fabrication method includes the following steps. A third hotspot group is searched from the integrated circuit design layout, wherein the third hotspot group includes hotspots from parametric defects. Then, the hotspot score is acquired according to the first hotspot group, the second hotspot group, the third hotspot group and the product functionality.

In an embodiment, the integrated circuit design and fabrication method includes the following steps. A fourth hotspot group is searched from the integrated circuit design layout, wherein the fourth hotspot group includes hotspots from process tool unit sensitivity. Then, the hotspot score is acquired according to the first hotspot group, the second hotspot group, the fourth hotspot group and the product functionality.

In an embodiment, the integrated circuit design and fabrication method includes the following steps. A third hotspot group and a fourth hotspot group are searched from the integrated circuit design layout, wherein the third hotspot group includes hotspots from parametric defects, and the fourth hotspot group includes hotspots from process tool unit sensitivity. Then, the hotspot score is acquired according to the first hotspot group, the second hotspot group, the third hotspot group, the fourth hotspot group and the product functionality.

In an embodiment, the product functionality is a speed-oriented product functionality or a power-oriented product functionality.

In an embodiment, the step of acquiring the hotspot score according to the first hotspot group, the second hotspot group and the product functionality includes sub-steps of weighted-scoring the first hotspot group according to the product functionality, so that a first group score corresponding to the first hotspot group is acquired, weighted-scoring the second hotspot group according to the product functionality, so that a second group score corresponding to the second hotspot group is acquired, and calculating a total of the first group score and the second group score to acquire the hotspot score.

In an embodiment, the step of correcting the integrated circuit design layout according to the first hotspot group and the second hotspot group is performed by performing an optical proximity correction on a photomask pattern corresponding to the integrated circuit design layout.

In an embodiment, the step of correcting the integrated circuit design layout according to the first hotspot group and the second hotspot group is performed by performing a metal slot and dummy fill technology.

In an embodiment, if the hotspot score is lower than a criterion, the integrated circuit design and fabrication method further includes an in-line real silicon wafer verification step.

In an embodiment, the in-line real silicon wafer verification step includes sub-steps of extracting hard fail defect patterns, and searching a circuit layout pattern corresponding to the hotspots from a real silicon wafer layout according to the hard fail defect patterns, and correcting the circuit layout pattern.

In an embodiment, the in-line real silicon wafer verification step comprises sub-steps of extracting soft fail electrical data, and searching a circuit layout pattern corresponding to the hotspots from a real silicon wafer layout according to the soft fail electrical data, and correcting the circuit layout pattern.

In an embodiment, the integrated circuit design and fabrication method further includes steps of sending uncorrected hotspots into a hotspot library, and classifying the uncorrected hotspots according to defect types, and allowing a circuit layout corresponding to the hotspots of the hotspot library to be fed back to a circuit layout designer.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A~1D are flowcharts illustrating a systematical and hierarchical analyzing method for detecting and scoring hotspots in an integrated circuit design layout according to an embodiment of the present invention. In accordance with the present invention, several indices are used to establish various models to perform various analyses after the integrated circuit design layout is finished, so that the electrical hotspots resulting from different factors can be identified.

The various analyses of the systematical and hierarchical analyzing method may be divided into four events. The start points of all events are based on the integrated circuit design layout 10. The first event is used to identify electrical hotspots from systematic defects. For example, by utilizing the indices about the routing in the integrated circuit design layout, a 3-dimensional multi-level interconnection electrical model is established to analyze the systematic defects in order to estimate the electrical hotspots associated with the routing detects.

Figure 2:
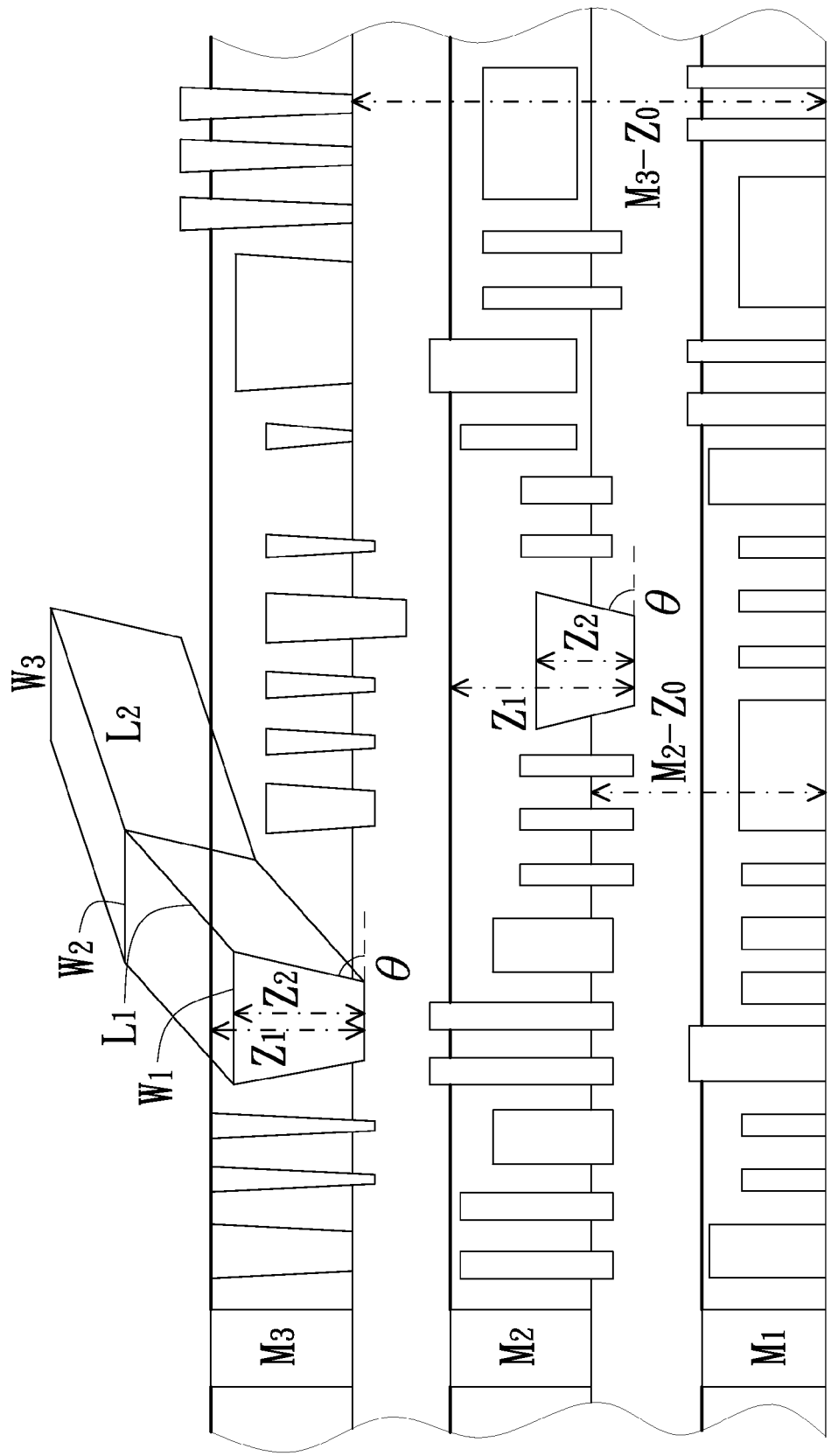
FIG. 2 is a schematic cross-sectional view illustrating a multi-level interconnection structure formed on an integrated circuit chip according to an embodiment of the present invention.

FIG. 2 is a schematic cross-sectional view illustrating a multi-level interconnection structure formed on an integrated circuit chip according to an embodiment of the present invention. As shown FIG. 2, several indices about routing include for example $Z_0$, $Z_1$, $Z_2$, W, L and θ. In FIG. 2, $M_2-Z_0$ denotes an average trench bottom height of a second metal layer $M_2$, $M_3-Z_0$ denotes an average trench bottom height of a third metal layer $M_3$, $Z_1$ is a metal conductor line depth, $Z_2$ is a trench depth, $W_1$, $W_2$, $W_3$ . . . denote the widths of the metal conductor line, $L_1$, $L_2$ . . . denote the lengths of the metal conductor line, and θ denotes an tilt angle of a trench sidewall. By using the indices $Z_0$, $Z_1$, $Z_2$, W, L and θ and referring to a simulation method proposed by the present inventors (see "A novel transient simulation for 3D multilevel interconnections on complex topography", Hsin-Ming Hou, et al. Electron Devices, IEEE Transactions on, Volume: 46 Issue: 4, pp. 690-695, April 1999), an electrical model of a multi-level interconnection structure in an integrated circuit chip is established and the electrical hotspots associated with routing are estimated. As described in this literature, the frequency response corresponding to each conductor line may be estimated by the simulation method. According to the frequency response, the technician can judge whether the integrated circuit design layout complies with the frequency requirements of transmitting signals. If the integrated circuit design layout does not comply with the frequency requirements, the integrated circuit design layout may be adjusted to eliminate the hotspots.

Generally, the above systematic defects may be classified into two types. The first type of systematic defect is a critical dimension defect (e.g. W, L and θ) resulting from the optical lithography process. The second type of systematic defect is a thickness defect (e.g. $Z_0$, $Z_1$ and $Z_2$) resulting from the chemical mechanical polishing (CMP) process. The integrated circuit design layout of the present invention may be adjusted by the following approaches. For minimizing the first type of systematic defect, an optical proximity correction (OPC) technology and an optical lithography are used to correct the photomask pattern. For minimizing the second type of systematic defect, a metal slot and dummy fill technology is used to adjust the material distribution on the polished surface, thereby eliminating the defect resulting from the CMP process.

Figure 1A:
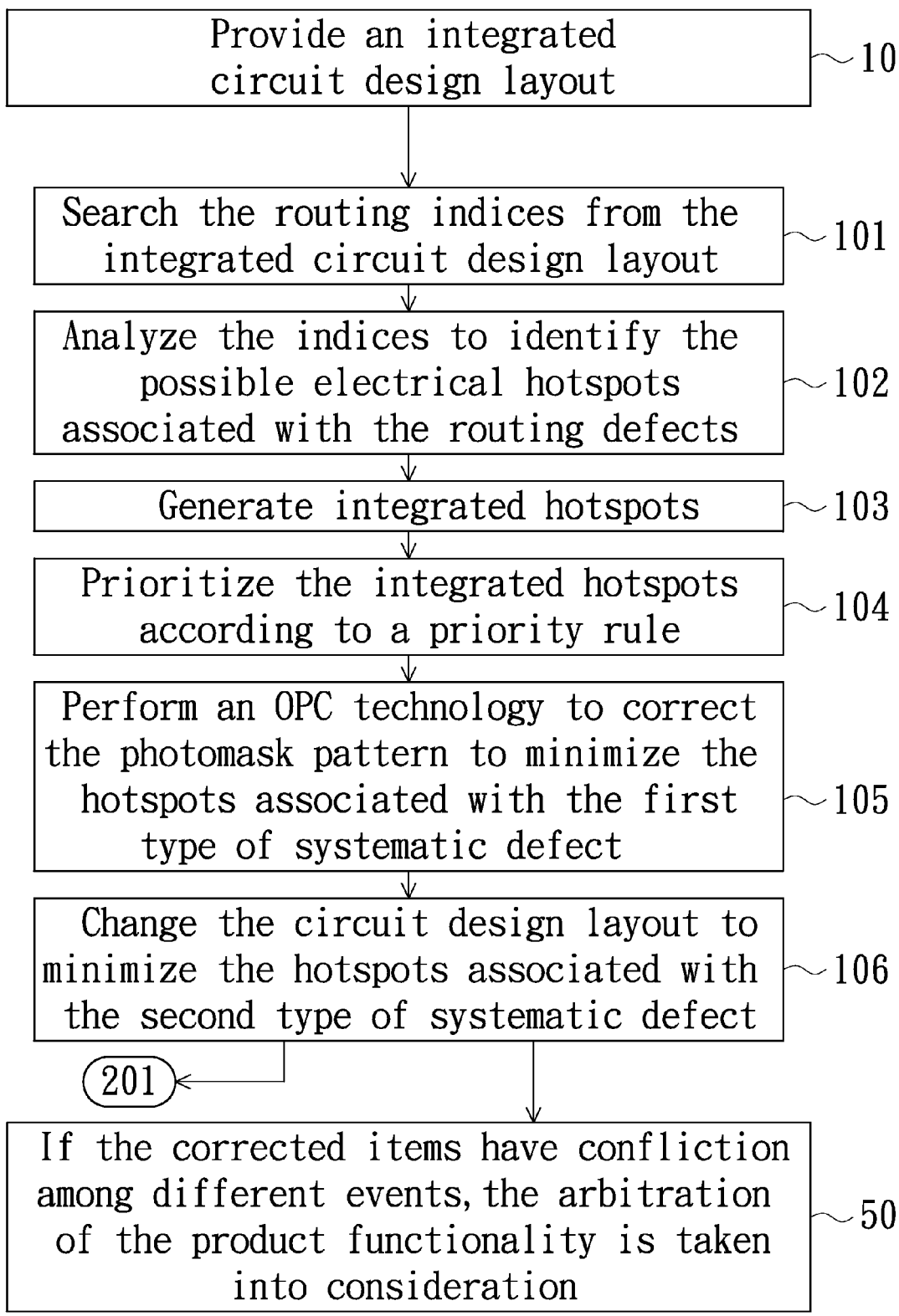
FIGS. 1A~1D are flowcharts illustrating a systematical and hierarchical analyzing method for detecting and scoring hotspots in an integrated circuit design layout according to an embodiment of the present invention.
Figure 1B:
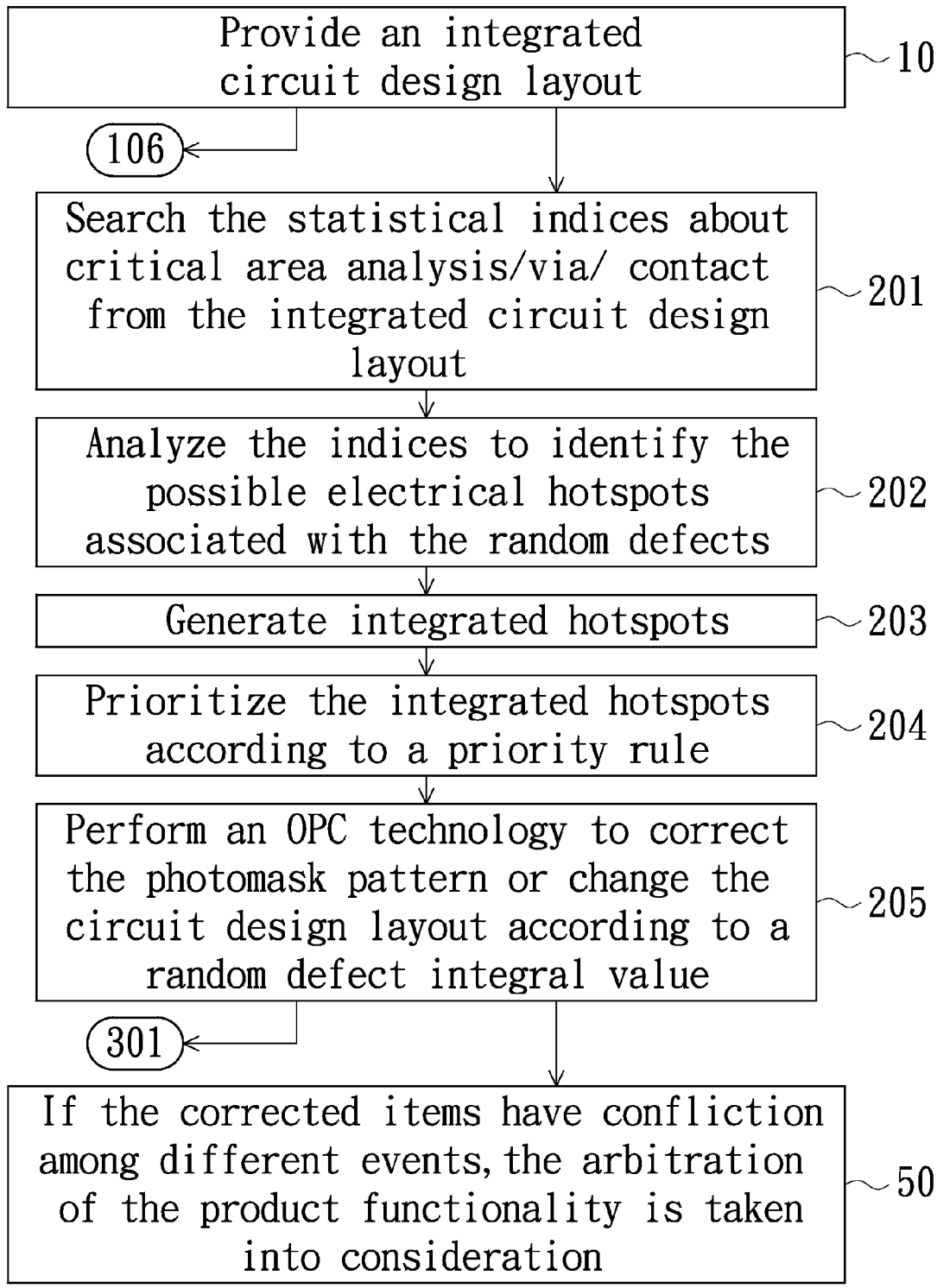
Figure 1C:
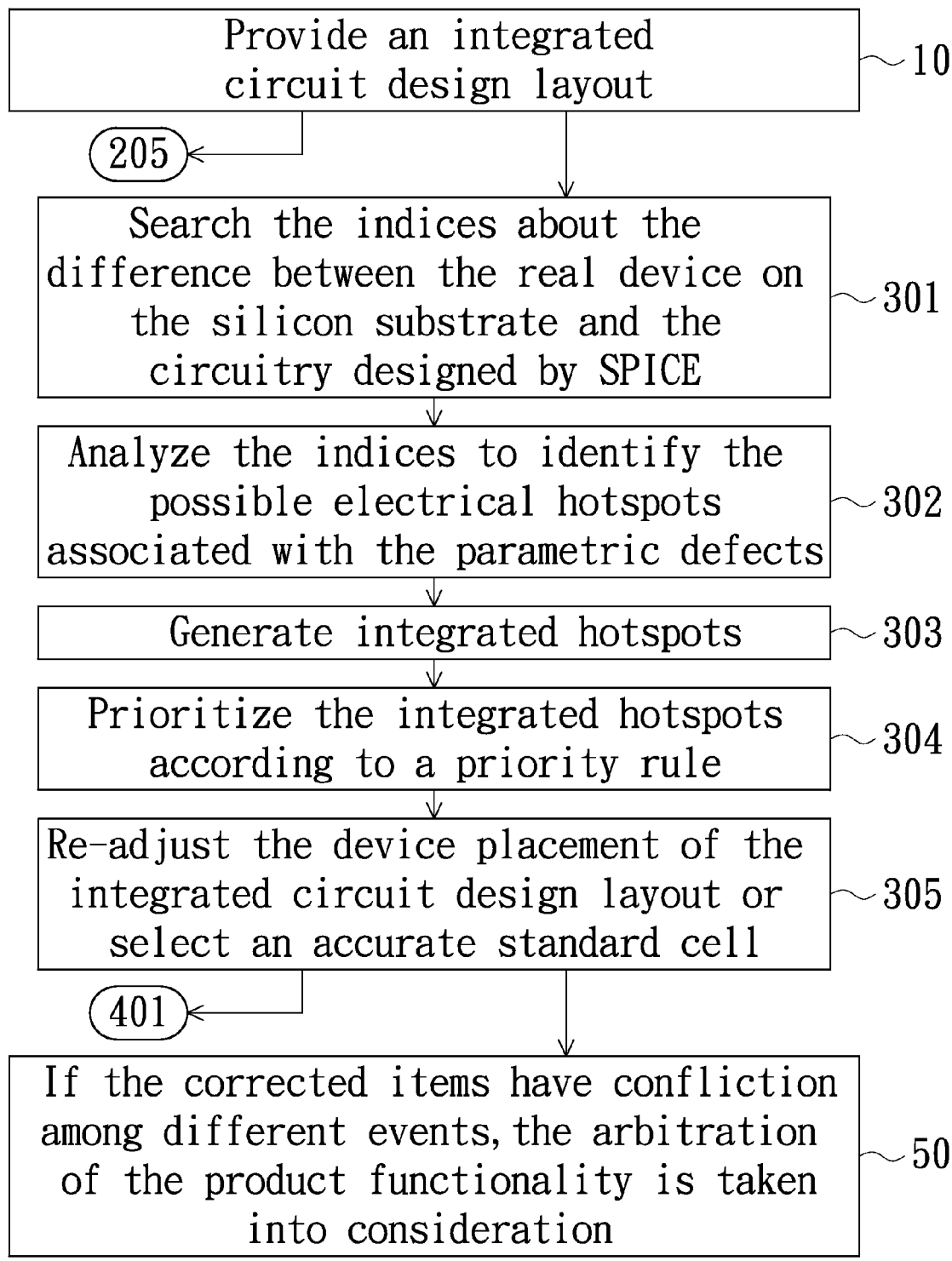
Figure 1D:
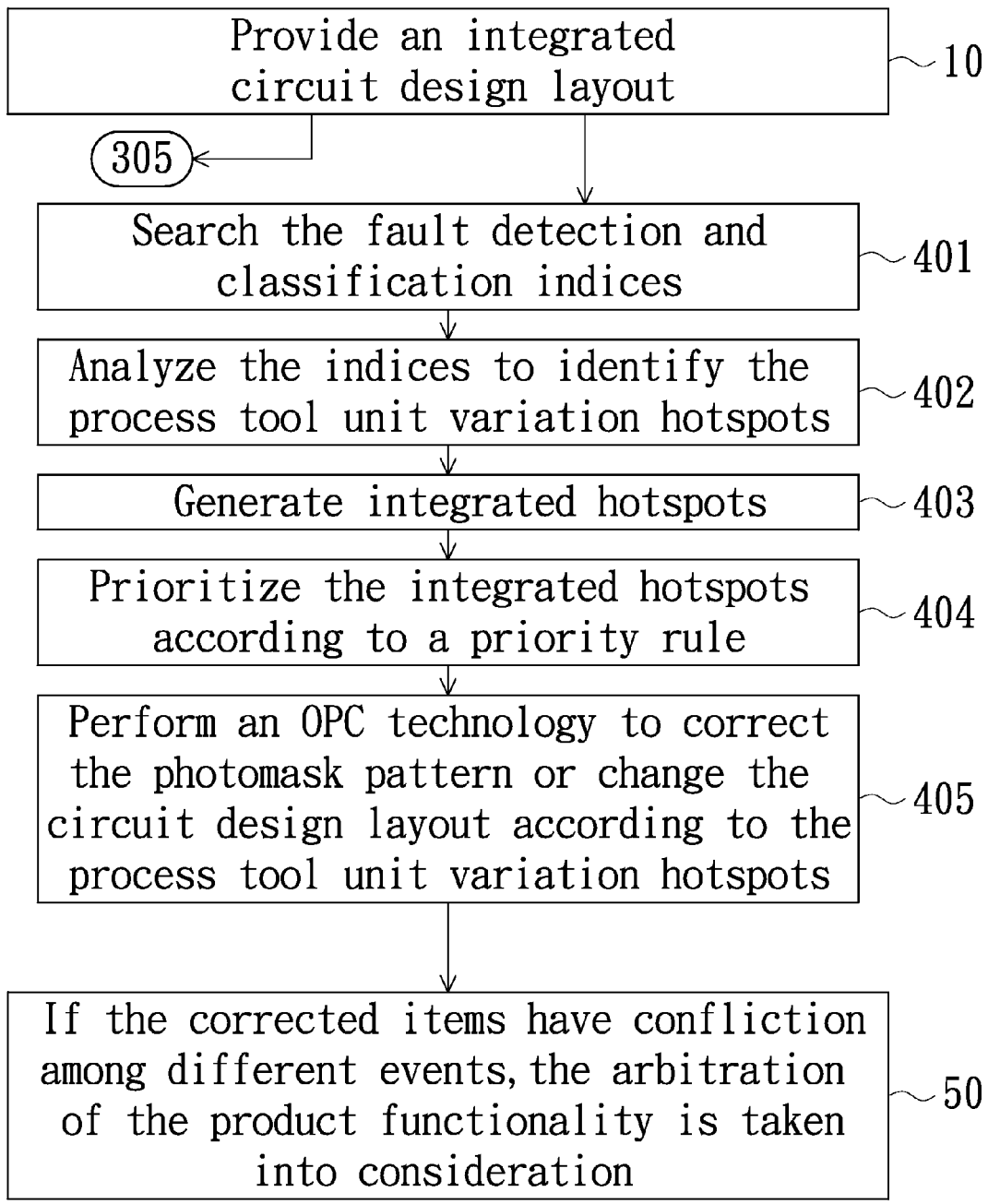

Please refer to the flowchart of FIG. 1A. Firstly, in the step 101, an integrated circuit design layout 10 is provided. In the step 101, the routing indices are searched from the integrated circuit design layout 10. Then, in the step 102, these indices are analyzed to identify the possible electrical hotspots associated with the routing defects. Then, in the step 103, integrated hotspots are generated. In the step 104, the integrated hotspots are prioritized according to a priority rule. Then, in the step 105, an optical proximity correction (OPC) technology is used to correct the photomask pattern in order to minimize the hotspots associated with the first type of systematic defect. In the step 106, the circuit design layout is changed in order to minimize the hotspots associated with the second type of systematic defect. For example, a metal slot and dummy fill technology is used to adjust the material distribution on the polished surface.

In addition to the first event, a second event is used to identify electrical hotspots from random defects. Please refer to the flowchart of FIG. 1B. In the step 201, the statistical indices about critical area analysis (CAA)/via/contact are searched from the integrated circuit design layout 10. Then, in the step 202, these indices are analyzed to identify the possible electrical hotspots associated with the random defects. In a co-pending Taiwanese Patent Application No. 100131680 (=U.S. patent application Ser. No. 13/225,495), which is entitled "Hierarchical yield and life time predict modeling" and was filed by the same assignee of the present application, a random defect integral value $\lambda_{R,DD}$ is used to identify the possible electrical hotspots associated with the statistical random hotspots. Then, in the step 203, integrated hotspots are generated. In the step 204, the integrated hotspots are prioritized according to a priority rule. If the integrated hotspots cannot meet the DFM (Design For Manufacturability) requirements, the step 205 is done. In the step 205, according to the random defect integral value $\lambda_{R,DD}$, an optical proximity correction (OPC) technology is used to correct the photomask pattern or the circuit design layout is changed. By changing the routing in the integrated circuit design layout or inserting the redundant via/contact structure, the random defect integral value $\lambda_{R,DD}$ of the integrated circuit design layout is satisfied to eliminate the random hotspots.

In addition to the first event and the second event, a third event is used to identify electrical hotspots from parametric defects in views of parametric marginality. Please refer to the flowchart of FIG. 1C. Generally, the performance of the real device which is formed on a silicon substrate and produced in the wafer manufacturing factory is somewhat different from the performance of the circuitry designed by a specified simulation program (e.g. a Simulation Program with Integrated Circuit Emphasis (SPICE)). In the step 301, the indices about the difference between the real device and the circuitry designed by SPICE are searched. For example, these indices include first-order effects (e.g. the rounding effect, a channel length/width (Leff/Weff) effect, and so on), and second-order or higher-order effects (e.g. a well proximity effect (WPE), a length of diffusion (LOD) effect, a poly space effect (PSE), an oxide diffusion space effect (OSE)). Then, in the step 302, these indices are analyzed to identify the possible electrical hotspots associated with the parametric defects. In a co-pending Taiwanese Patent Application No. 100134602 (=U.S. patent application Ser. No. 13/245,504), which is entitled "Addressable array robust circuit design" and was filed by the same assignee of the present application, a plurality of test keys are placed on the non-device area of the wafer to measure the electrical properties. After the electrical properties of the electronic devices at different zones of the wafer are realized, a process-related standard cell library is established. By comparing the above indices with the standard cell library, the hotspots associated with the parametric marginality are identified. Then, in the step 303, integrated hotspots are generated. In the step 304, the integrated hotspots are prioritized according to a priority rule. If the integrated hotspots cannot meet the DFM (Design For Manufacturability) requirements about device match and uniformity, the step 305 is done. In the step 305, the device placement of the integrated circuit design layout is re-adjusted or an accurate standard cell is selected. In such way, the electrical properties of the device in the integrated circuit design layout can meet the timing and power-saving requirements, and thus the hotspots are eliminated.

In addition to the first event, the second event and the third event, a fourth event is used to identify electrical hotspots from the sensor sensitivity of the process tool unit (PU). Please refer to the flowchart of FIG. 1D. For example, the fault detection and classification (FDC) indices for real-time monitoring the working status of the process tool unit (PU) are analyzed to identify the hotspots. In the step 401, the PU sensor FDC indices are searched. Then, in the step 402, these indices are analyzed. In a co-pending Taiwanese Patent Application Nos. 100131680 (=U.S. patent application Ser. No. 13/225,495) (entitled "Hierarchical yield and life time predict modeling method") and U.S. patent application Ser. No. 13/287,097 (entitled "Design of experiments method for predicting wafer fabrication outcome") which were filed by the same assignee of the present application, the FDC sensitivity and uniformity (U %) are used to identify the PU variation hotspots. Then, in the step 403, integrated hotspots are generated. In the step 404, the integrated hotspots are prioritized according to a priority rule. If the integrated hotspots cannot meet the DFM (Design For Manufacturability) requirements, the step 405 is done. In the step 405, according to the PU sensor FDC indices, an optical proximity correction (OPC) technology is used to correct the photomask pattern or the circuit design layout is changed. Consequently, the integrated circuit design layout is satisfied to eliminate the hotspots.

It is not necessary to implement all of the first event, the second event, the third event and the fourth event. According to the practical requirements, two of the above events may be implemented to increase the efficacy of eliminate the hotspots. Of course, as more events are taken into consideration, the efficacy of eliminate the hotspots will be further enhanced.

In FIGS. 1A~1D, the step 50 is an arbitration step. If the corrected items have confliction among different events, the arbitration of the product functionality should be taken into consideration. For example, the corrected items for the speed-oriented product functionality and the corrected items for the power-oriented product functionality are different. In this step, various hotspots are scored according to the product functionality. For example, several hotspot groups may be weight-scored according to the product functionality, so that several scores of different hotspot groups are acquired. Depending on the score, the optical proximity correction (OPC) technology or the process of changing the circuit design layout is selectively performed. In addition, the standard cell library may be classified according to the product functionality. Similarly, the standard cell library is speed-oriented or power-oriented. Moreover, according to the product functionality, the priority rules for the above events may be determined in order to realize which kinds of hotspots have the high priority to be processed.

Figure 3:
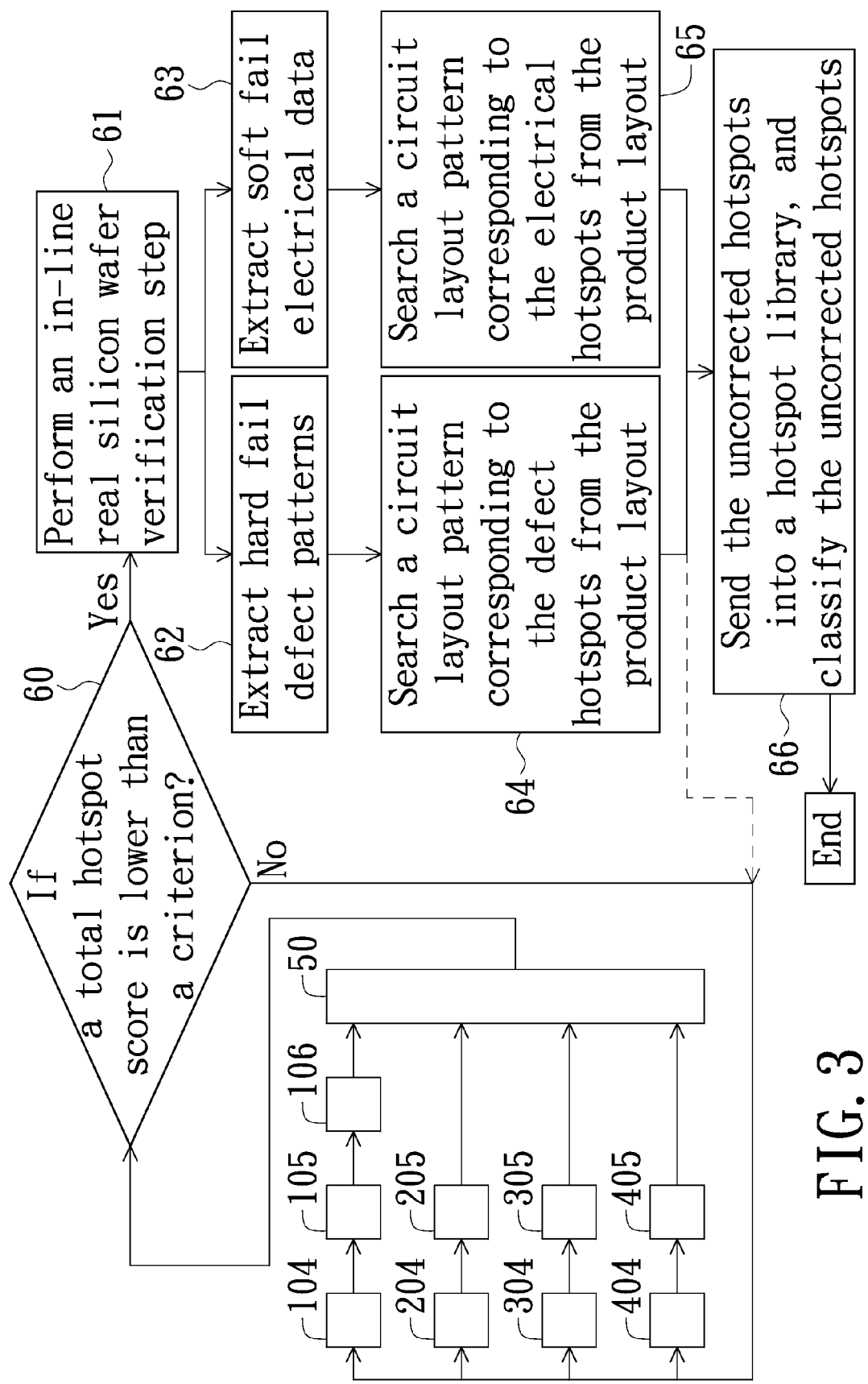
FIG. 3 is flowchart illustrating the subsequent process of the systematical and hierarchical analyzing method of the present invention after the arbitration step is performed.

FIG. 3 is flowchart illustrating the subsequent process of the systematical and hierarchical analyzing method of the present invention after the arbitration step is performed. After a total hotspot score is acquired, the step 60 is performed to judge whether a total hotspot score is lower than a criterion. The total hotspot score is the sum of the scores obtained from the above events and weighted according to the production functionality. Whereas, if the total hotspot score is higher than the criterion, it means that the optical proximity correction (OPC) correction or the changed circuit design layout cannot meet the DFM requirement. Under this circumstance, the steps 104, 105 and 106, or the steps 204 and 205, or the steps 304 and 305, or the steps 404 and 405 are repeatedly done (see the events 1~4 of FIG. 1). After the arbitration step 50 is performed, the step 60 is repeatedly done. These steps are repeatedly done until the total hotspot score is lower than the criterion. Then, an in-line real silicon wafer verification step (i.e. the step 61) is performed.

Then, the step 62 and the step 63 are performed to extract the hard fail defect patterns and the soft fail electrical data, respectively. The hard fail defect patterns denote the defects detected in the real product. The soft fail electrical data denote the defects that mismatch the device performance according to electrical data measured by the electrical measurement method such as a DOE (Design Of Experiment) method. After the hard fail defect patterns and the soft fail electrical data are extracted, the steps 64 and 65 are respectively performed to search a circuit layout pattern corresponding to the defect hotspots and the electrical hotspots from the product layout. Then, the number of hotspots in the events 1~4 are continuously reduced to the minimum (along the dotted line). If there are still some hotspots unable to be corrected, the step 66 is performed. In the step 66, the uncorrected hotspots are sent into a hotspot library, and the uncorrected hotspots are classified according to the defect types (e.g. critical dimension, the electrical parameters, uniformity, mismatch, PU sensitivity, and so on). Moreover, the circuit layout corresponding to the hotspot in the hotspot library may be fed back to the designer and inform the designer that the corresponding circuit layout should be avoided in the further.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. An integrated circuit design and fabrication method, comprising steps of:
   providing an integrated circuit design layout;
   searching a first hotspot group and a second hotspot group from the integrated circuit design layout by analyzing routing indices and statistical indices, wherein the first hotspot group includes hotspots from systematic defects, and the second hotspot group includes hotspots from random defects;

acquiring a hotspot score by using a computer according to the first hotspot group, the second hotspot group and a product functionality; and if the hotspot score is higher than a criterion, correcting the integrated circuit design layout according to the first hotspot group and the second hotspot group.

2. The integrated circuit design and fabrication method according to claim 1, wherein the step of analyzing routing indices and statistical indices is respectively performed with a 3-dimensional multi-level interconnection electrical model and a random defect integral value.

3. The integrated circuit design and fabrication method according to claim 1, further comprising steps of:

searching a third hotspot group from the integrated circuit design layout, wherein the third hotspot group includes hotspots from parametric defects; and acquiring the hotspot score according to the first hotspot group, the second hotspot group, the third hotspot group and the product functionality.

4. The integrated circuit design and fabrication method according to claim 1, further comprising steps of:

searching a fourth hotspot group from the integrated circuit design layout, wherein the fourth hotspot group includes hotspots from process tool unit sensitivity; and acquiring the hotspot score according to the first hotspot group, the second hotspot group, the fourth hotspot group and the product functionality.

5. The integrated circuit design and fabrication method according to claim 1, further comprising steps of:

searching a third hotspot group and a fourth hotspot group from the integrated circuit design layout, wherein the third hotspot group includes hotspots from parametric defects, and the fourth hotspot group includes hotspots from process tool unit sensitivity; and acquiring the hotspot score according to the first hotspot group, the second hotspot group, the third hotspot group, the fourth hotspot group and the product functionality.

6. The integrated circuit design and fabrication method according to claim 1, wherein the product functionality is a speed-oriented product functionality or a power-oriented product functionality.

7. The integrated circuit design and fabrication method according to claim 6, wherein the step of acquiring the hotspot score according to the first hotspot group, the second hotspot group and the product functionality includes sub-steps of:

weighted-scoring the first hotspot group according to the product functionality, so that a first group score corresponding to the first hotspot group is acquired;

weighted-scoring the second hotspot group according to the product functionality, so that a second group score corresponding to the second hotspot group is acquired; and calculating a total of the first group score and the second group score, thereby acquiring the hotspot score.

8. The integrated circuit design and fabrication method according to claim 1, wherein the step of correcting the integrated circuit design layout according to the first hotspot group and the second hotspot group is performed by performing an optical proximity correction on a photomask pattern corresponding to the integrated circuit design layout.

9. The integrated circuit design and fabrication method according to claim 1, wherein the step of correcting the integrated circuit design layout according to the first hotspot group and the second hotspot group is performed by performing a metal slot and dummy fill technology.

10. The integrated circuit design and fabrication method according to claim 1, wherein if the hotspot score is lower than a criterion, the integrated circuit design and fabrication method further comprises an in-line real silicon wafer verification step.

11. The integrated circuit design and fabrication method according to claim 10, wherein the in-line real silicon wafer verification step comprises sub-steps:

extracting hard fail defect patterns; and searching a circuit layout pattern corresponding to the hotspots from a real silicon wafer layout according to the hard fail defect patterns, and correcting the circuit layout pattern.

12. The integrated circuit design and fabrication method according to claim 10, wherein the in-line real silicon wafer verification step comprises sub-steps:

extracting soft fail electrical data; and searching a circuit layout pattern corresponding to the hotspots from a real silicon wafer layout according to the soft fail electrical data, and correcting the circuit layout pattern.

13. The integrated circuit design and fabrication method according to claim 10, further comprising steps:

sending uncorrected hotspots into a hotspot library, and classifying the uncorrected hotspots according to defect types; and allowing a circuit layout corresponding to the hotspots of the hotspot library to be fed back to a circuit layout designer.

* * * * *